United States Patent [19]

Lien

[11] Patent Number: 5,693,975
[45] Date of Patent: Dec. 2, 1997

[54] COMPACT P-CHANNEL/N-CHANNEL TRANSISTOR STRUCTURE

[75] Inventor: Chuen-Der Lien, Los Altos Hills, Calif.

[73] Assignee: Integrated Device Technology, Inc., Santa Clara, Calif.

[21] Appl. No.: 539,805

[22] Filed: Oct. 5, 1995

[51] Int. Cl.$^6$ .......................... H01L 29/06; H01L 29/04; H01L 29/76; H01L 27/11
[52] U.S. Cl. .................. 257/374; 257/41; 257/56; 257/69; 257/369; 257/371; 257/377; 257/903
[58] Field of Search ................. 257/69, 369, 371, 257/377, 903, 374, 41, 56

[56] References Cited

U.S. PATENT DOCUMENTS

| | | | |
|---|---|---|---|
| 4,700,454 | 10/1987 | Baerg et al. | 257/374 |
| 4,778,775 | 10/1988 | Tzeng | 437/57 |
| 4,862,232 | 8/1989 | Lee | 257/374 |
| 5,043,778 | 8/1991 | Teng et al. | 257/377 |
| 5,187,122 | 2/1993 | Bonis | 437/41 |
| 5,429,958 | 7/1995 | Matlock | 437/34 |

FOREIGN PATENT DOCUMENTS

| | | | |
|---|---|---|---|
| 6239063 | 11/1985 | Japan | 257/377 |

Primary Examiner—Mahshid D. Saadat
Assistant Examiner—Valencia Martin Wallace
Attorney, Agent, or Firm—Skjerven, Morrill, MacPherson, Franklin & Friel

[57] ABSTRACT

A structure for a complementary field effect transistor includes a semiconductor body having a first body region of a first conductivity type and an adjoining second body region of an opposite second conductivity type. A buried dielectric region is located in the semiconductor body beneath the upper semiconductor surface and extends into the first and second body regions. A first drain region of the second conductivity type is located in the semiconductor body and adjoins the first body region, the dielectric region and the upper semiconductor surface. A second drain region of the first conductivity type is located in the semiconductor body and adjoins the second body region, the dielectric region and the upper semiconductor surface. The two drain regions are adjacent to one another. The buried dielectric region underlies the two drain regions and contacts portions of both drain regions so as to (a) isolate the first drain region from the second body region and (b) isolate the second drain region from the first body region. The transistor structure can be fabricated according to processes in which formation of the body regions is initiated before or after the dielectric region is formed.

11 Claims, 20 Drawing Sheets

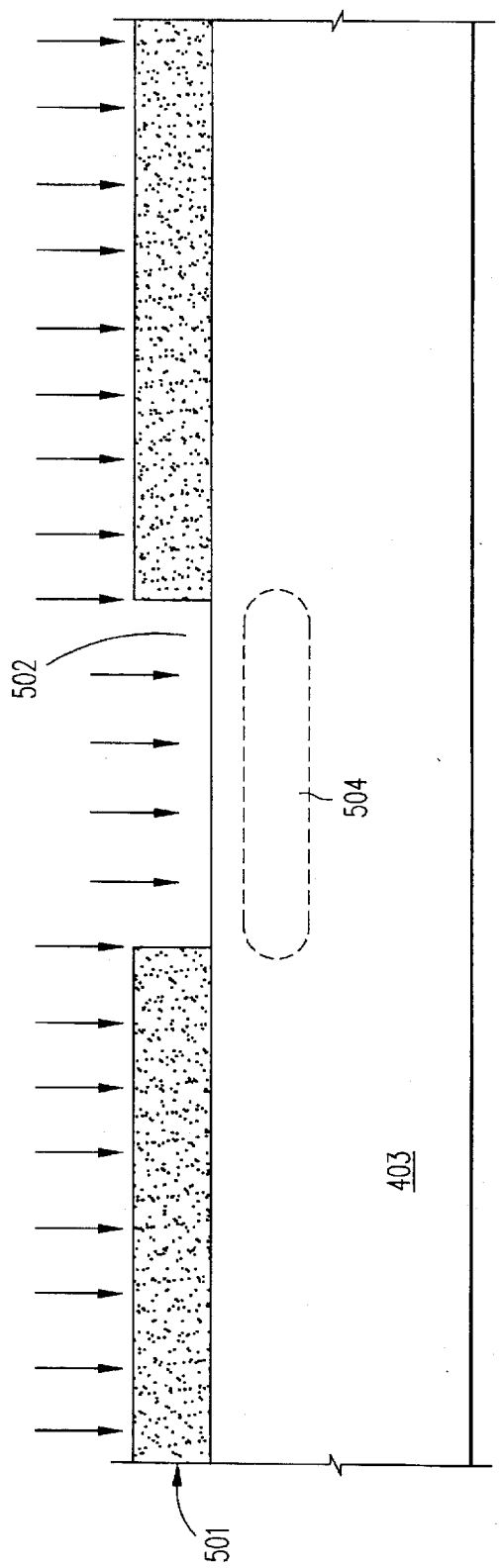
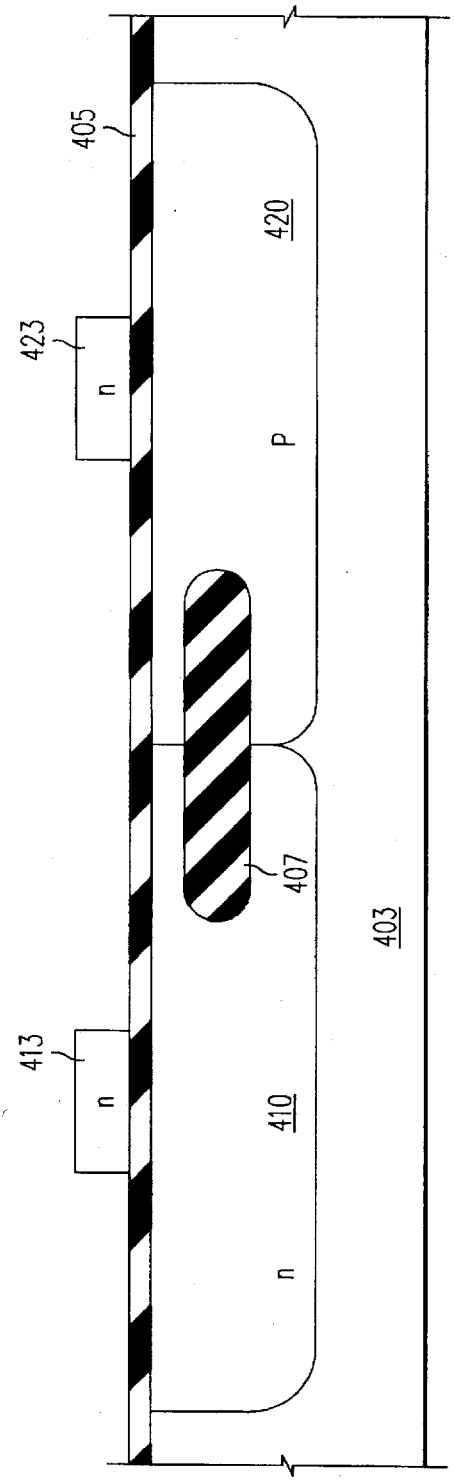
FIG. 5a
FIG. 5b

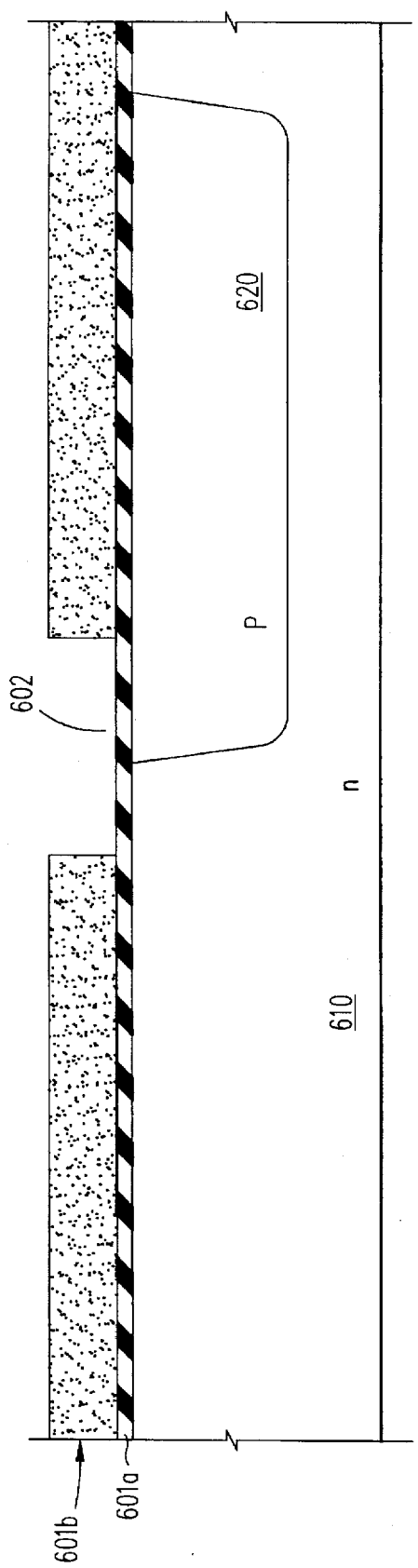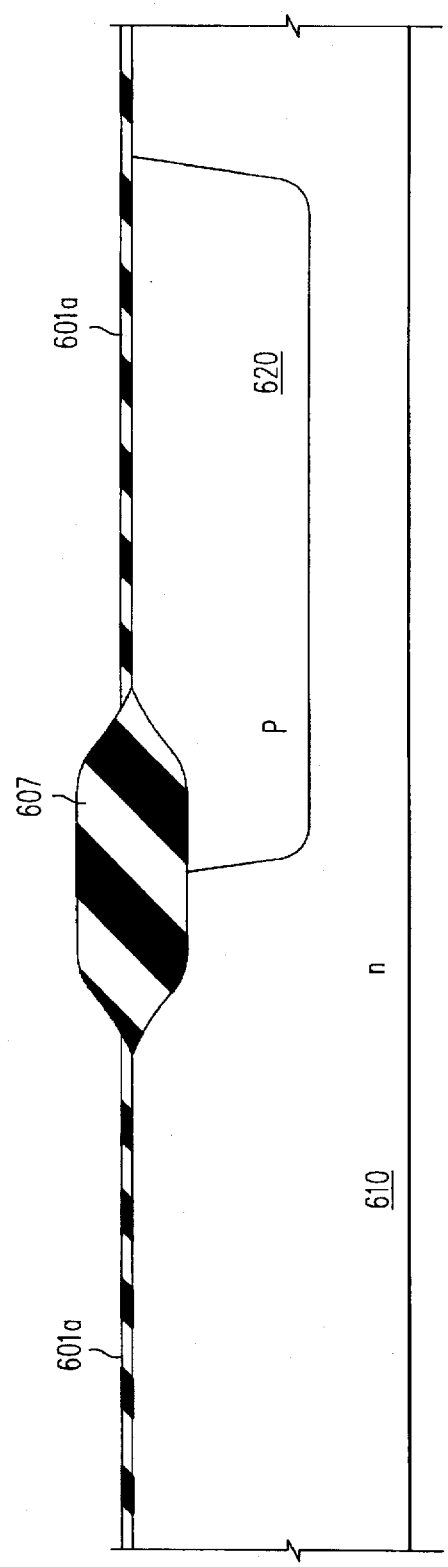

COMPACT P-CHANNEL/N-CHANNEL TRANSISTOR STRUCTURE

FIELD OF THE INVENTION

This invention relates to a semiconductor structure which includes p-channel and n-channel field effect transistors (FETs) fabricated next to one another on the same chip. The invention also relates to a method for fabricating adjacent p-channel and n-channel FETs. The invention has broad applicability to both memory cells and logic circuits.

BACKGROUND OF THE INVENTION

P-channel and n-channel MOS FETs are used together in many prior art integrated circuits. In some of these integrated circuits, the drain of an n-channel FET is connected to the drain of a p-channel FET.

For example, FIG. 1 illustrates a conventional CMOS inverter circuit 100 which includes first voltage supply terminal 101, second voltage supply terminal 102, p-channel FET 103, n-channel FET 104, input terminal 105 and output terminal 106. The drain of p-channel FET 101 is connected to the drain of n-channel FET 102. Certain digital logic circuits, such as NAND and NOR gates, are derived from inverter circuit 100. Consequently, these digital logic circuits also include p-channel and n-channel FETs which have their drains connected.

FIG. 2 shows a conventional six transistor MOS SRAM memory cell 200 which includes first voltage supply terminal 201, second voltage supply terminal 202, word line 203, bit lines 204-205, p-channel load FETs 206-207, cross-coupled n-channel storage FETs 208-209, and n-channel access FETs 210-211. In memory cell 200, the drain of p-channel FET 206 is connected to the drain of n-channel FET 208. Similarly, the drain of p-channel FET 207 is connected to the drain of n-channel FET 209.

FIG. 3 illustrates a cross sectional view of a typical interconnection between p-channel FET 301 and n-channel FET 302. P-channel FET 301 is created from n-type region 310 and includes drain region 311, source region 312 and gate electrode 313. N-channel FET 302 is created from p-type region 320 and includes drain region 321, source region 322 and gate electrode 323. Gate oxide layer 305 is located between gate electrode 313 and n-type region 310, and between gate electrode 323 and p-type region 320. Field oxide region 307 is formed along the upper surface of n-type region 310 and p-type region 320, between drain regions 311 and 321. Insulating layer 306 is located over the complementary transistor structure, with contact openings extending to the source and drain regions of FETs 301 and 302. A metal layer, which includes metal electrodes 331-333, is located over insulating layer 306. Metal electrodes 331 and 333 contact source regions 312 and 322, respectively. Metal electrode 332 contacts drain regions 311 and 321, thereby providing an electrical connection between the drain of p-channel FET 301 and the drain of n-channel FET 302.

Electrical isolation of FETs 301 and 302 is achieved because (1) field oxide 307 and p-type region 320 isolate n-type region 310 and n+ drain region 321 from each other, and (2) field oxide 307 and n-type region 310 isolate p-type region 320 and p+ drain region 311 from each other. However, the physical separation between p+ drain region 311 and p-type region 320, and between n+ drain region 321 and n-type region 310, causes the layout area of FETs 301 and 302 to be relatively large. The typical lateral spacing between p+ drain region 311 and n+ drain region 321 is typically 5-10 μm. Consequently, the configuration illustrated in FIG. 3 is undesirable in a circuit which utilizes a large number of drain-connected p-channel/n-channel FET pairs. For example, the configuration of FIG. 3 is undesirable in a memory device which has a large number of memory cells like SRAM memory cell 200 (FIG. 2).

Additionally, an SRAM memory cell which includes the configuration of FIG. 3 is susceptible to alpha particle upset. Alpha particle upset of MOS FETs in SRAM memory cells is a well-known problem. Alpha particles can cause the state of an SRAM memory cell to change in a random, normally undesirable manner. The alpha particle upset problem becomes increasingly serious as technology advances and transistor dimensions shrink. The sensitivity of SRAM memory cell 200 (FIG. 2) to alpha particles is directly related to the area of the junction between the drains of FETs 206-209 and the underlying substrate. As the area of the junction between the drains and substrate of FETs 206-209 is reduced, the effects of alpha particle upset are also reduced.

The configuration of FIG. 3 also results in undesirable junction capacitances between n-type region 310 and p+ drain 311, and between p-type region 320 and n+ drain 321. The magnitudes of these junction capacitances increase as the area of the junction between n-type region 310 and p+ drain 311 and the area of the junction between p-type region 320 and n+ drain 321 increase. These junction capacitances can reduce the operating speed of certain devices, such as inverter circuit 100 (FIG. 1).

It would therefore be desirable to have a method and structure for connecting the drain of a p-channel FET to the drain of an n-channel FET to create a circuit having a reduced layout area and a reduced junction area between the drains and underlying substrate of the p-channel and n-channel FETs. Such a method and structure would reduce overall circuit layout area, reduce the susceptibility of an SRAM memory cell to alpha particle upset, and minimize the junction capacitance of the circuit.

SUMMARY OF THE INVENTION

In accordance with the invention, a semiconductor structure for a complementary field effect transistor pair is provided. This structure includes a semiconductor body having a first body region, an adjoining second body region and an upper surface. The first body region is of a first conductivity type, and the second body region is of a second conductivity type opposite to the first conductivity type.

A dielectric region is located in the semiconductor body beneath the upper surface of the semiconductor body and extends into the first and second body regions. A first drain region of the second conductivity type is located in the semiconductor body. This first drain region adjoins the first body region, the buried dielectric region and the upper surface of the semiconductor body. A second drain region of the first conductivity type is also located in the semiconductor body. The second drain region adjoins the second body region, the buried dielectric region and the upper surface of the semiconductor body. The first and second drain regions adjoin one another, thereby reducing the layout area of the FET pair.

The buried dielectric region underlies the first and second drain regions and contacts portions of the first and second drain regions so as to (a) isolate the first drain region from the second body region and (b) isolate the second drain region from the first body region. Because portions of the first and second drain regions contact the underlying buried dielectric region, the junction area between these drain regions and the body regions is reduced, thereby reducing junction capacitances and the effects of alpha particle upset.

In another embodiment, a transistor structure includes a source/drain region located in a semiconductor body, adjacent to the upper surface of the semiconductor body. A buried dielectric region is located in the semiconductor body under the source/drain region, such that a portion of the dielectric region adjoins a portion of the source/drain region. As a result, the junction capacitance of the transistor structure is reduced. Additionally, the effects of alpha particle upset on the transistor structure are reduced.

The present invention further includes methods of forming a transistor structure from a semiconductor body. One of these methods includes the steps of:

(1) forming a dielectric region in the semiconductor body below the upper surface of the semiconductor body, (2) forming a first body region of a first conductivity type in the semiconductor body, (3) forming a second body region of a second conductivity type opposite the first conductivity type in the semiconductor body. The first body region is adjacent to the second body region, and the dielectric region extends into the first and second body regions.

(4) forming a first drain region of the second conductivity type in the first body region such that the first drain region adjoins the dielectric region, the first body region and the upper surface of the semiconductor body, and (5) forming a second drain region of the first conductivity type in the second body region such that the second drain region adjoins the dielectric region, the second body region and the upper surface of the semiconductor body. The second drain region is also adjacent to the first drain region.

Another method in accordance with the invention entails fabricating a transistor structure from a semiconductor body having a first body region of a first conductivity type and an adjacent second body region of a second conductivity type opposite to the first conductivity type. This method includes the steps of:

(1) forming a dielectric region in the semiconductor body along the upper surface of the semiconductor body such that the dielectric region extends into the first and second body regions, (2) growing a semiconductor layer over the two body regions and the dielectric region such that the semiconductor layer is of the first conductivity type over the first body region and is of the second conductivity type over the second body region, (3) forming a first drain region of the second conductivity type in the semiconductor layer over the first body region such that the first drain region adjoins the first body region, the dielectric region and the upper surface of the semiconductor layer, and (4) forming a second drain region of the first conductivity type in the semiconductor layer over the second body region such that the second drain region adjoins the second body region, the dielectric region and the upper surface of the semiconductor layer. The second drain region is formed adjacent to the first drain region.

A further method includes the steps of:

(1) forming a dielectric region along the upper surface of a semiconductor body, (2) forming a semiconductor layer over the dielectric region and the upper surface of the semiconductor body, (3) crystallizing the semiconductor layer, (4) forming a first body region of a first conductivity type in the semiconductor layer and the semiconductor body, (5) forming a second body region of a second conductivity type opposite the first conductivity type in both the semiconductor layer and the semiconductor body. The first and second body regions are formed adjacent to one another and the dielectric region extends into the first and second body regions.

(6) forming a first drain region of the second conductivity type in the first body region such that the first drain region adjoins the first body region, the dielectric region and the upper surface of the semiconductor layer, and (7) forming a second drain region of the first conductivity type in the second body region such that the second drain region adjoins the second body region, the dielectric region and the upper surface of the semiconductor layer. The second drain region is formed adjacent to the first drain region.

The step of crystallizing the semiconductor layer is preferably carried out using a laser beam or by heating.

Another method in accordance with the invention includes the steps of:

(1) forming a dielectric region along the upper surface of a semiconductor body, (2) forming a semiconductor layer over the dielectric region and the upper surface of the semiconductor body. The semiconductor layer has a monocrystalline structure where this layer is formed on the semiconductor body and a non-monocrystalline structure where this layer is formed on the dielectric region.

(3) forming a first body region of a first conductivity type in the semiconductor layer and the semiconductor body.

(4) forming a second body region of a second conductivity type opposite the first conductivity type in the semiconductor layer and the semiconductor body. The first and second body regions are formed adjacent to each other, and the dielectric region extends into the first and second body regions.

(5) forming a first drain region of the second conductivity type in the first body region such that the first drain region adjoins the first body region, the dielectric region and the upper surface of the semiconductor layer, and (6) forming a second drain region of the first conductivity type in the second body region such that the second drain region adjoins the second body region, the dielectric region and the upper surface of the semiconductor layer. The second drain region is also adjacent to the first drain region.

In the above described methods, the steps of forming the dielectric region, first body region, second body region, first drain region and second drain region can be initiated in different orders in different embodiments of the invention. In another embodiment of the invention, the semiconductor body is used in place of the second body region. In other words, the semiconductor body is of the second conductivity type, as is the second body region.

The above described methods result in structures having first and second drain regions located adjacent to one another. This effectively reduces the layout area of the transistor structure and allows a single electrode to make a connection to both the first and second drain regions. Because these methods also result in first and second drain regions which adjoin the underlying dielectric region, the resulting transistor structure has reduced sensitivity to alpha particle upset. Moreover, the steps of the above described methods do not unduly increase process complexity.

Another method is also provided for forming a transistor in a semiconductor body. This method includes the steps of forming a dielectric region in the semiconductor body below the upper surface of the semiconductor body, and forming a source/drain region in the semiconductor body over the dielectric region. This method results in a transistor having a low junction capacitance and a low susceptibility to alpha particle upset.

BRIEF DESCRIPTION OF THE DRAWINGS

FIGS. 5a–5e are cross-sectional views illustrating one method for making the FET structure of FIG. 4;

FIGS. 6a–6g are cross-sectional views illustrating another method for forming an FET structure in accordance with the invention;

DETAILED DESCRIPTION OF THE INVENTION

Figure 4:
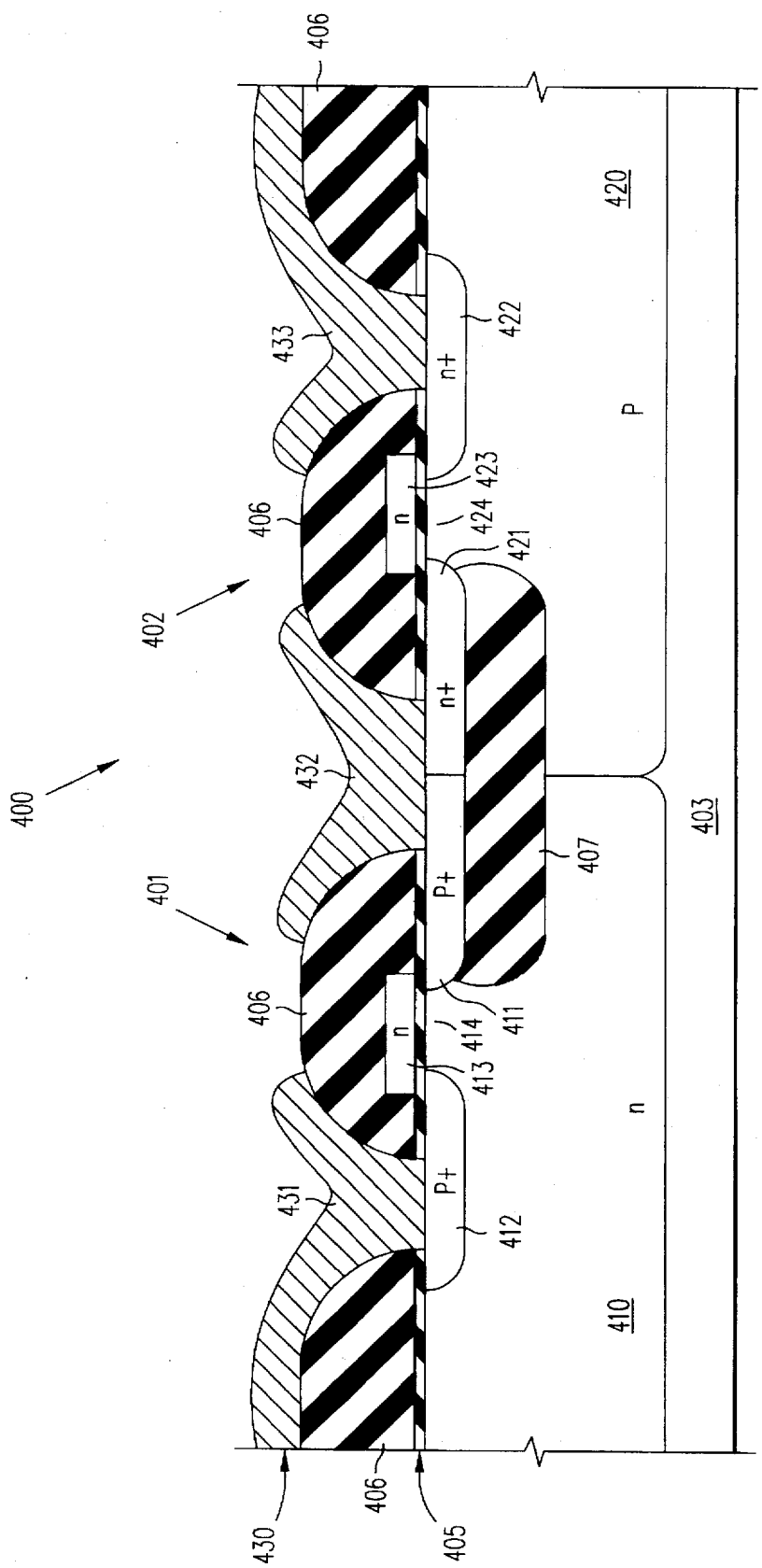
FIG. 4 is a cross-sectional view of a drain-to-drain connection between an n-channel FET and a p-channel FET in accordance with the invention.

FIG. 4 illustrates a compact complementary p-channel/n-channel transistor structure 400 in accordance with one embodiment of the invention. Transistor structure 400 includes p-channel FET 401 and n-channel FET 402, which are both typically enhancement-mode devices formed in monocrystalline semiconductor substrate 403. Substrate 403 is typically p-type, n-type or intrinsic silicon.

P-channel FET 401 includes n-type semiconductor body region 410, p+ source region 412, p+ drain region 411, n-type channel region 414 and n+ gate electrode 413. N-channel FET 402 includes p-type semiconductor body region 420, n+ source region 422, n+ drain region 421, p-type channel region 424 and n+ gate electrode 423. Gate electrodes 413 and 423 are typically polysilicon. Gate oxide layer 405 is located under gate electrodes 413 and 423. Insulating layer 406 is located over gate oxide layer 405 and gate electrodes 413 and 423. N-type body region 410 is illustrated as an n-well region, and p-type body region 420 is illustrated as a p-well region.

In other embodiments, the p-type body region can be part of a p-type semiconductor substrate, again typically monocrystalline silicon, or part of a p-type epitaxial layer grown over a semiconductor substrate, while the n-type body region is still an n-well region. In yet another variation, n-type region 410 is part of an n-type semiconductor substrate or part of an n-type epitaxial layer formed over a semiconductor substrate, while p-type region 420 remains a p-well region. The upper portions of body regions 410 and 420 could be parts of an epitaxial layer in which FETs 401 and 402 are formed, while the lower portions of body regions 410 and 420 are parts of a semiconductor substrate or an epitaxial layer overlying a semiconductor substrate.

Buried dielectric region 407 is located beneath p+drain region 411 and n+ drain region 421, and extends into regions 410 and 420. Buried dielectric region 407 allows p+ drain region 411 to adjoin n+ drain region 421. Buried dielectric region 407 electrically isolates n+ drain region 421 from n-type region 410. Similarly, buried dielectric region 407 electrically isolates p+ drain region 411 from p-type region 420. Because p+ drain region 411 of p-channel FET 401 adjoins n+ drain region 421 of n-channel FET 402, the overall layout area of transistor structure 400 is less than the layout area of a conventional CMOS inverter circuit (e.g., FIG. 3).

Moreover, the junction capacitance of transistor structure 400 is reduced because the area of the junction between n-type region 410 and p+ drain 411 is reduced, and because the area of the junction between p-type region 420 and n+ drain 421 is reduced. As a result, the speed of an inverter which utilizes transistor structure 400 is increased.

Figure 1:
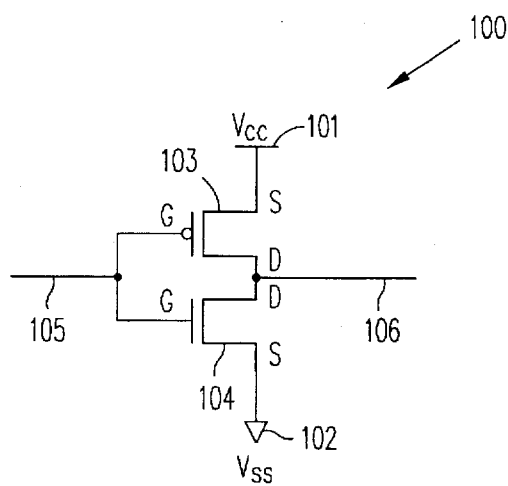
FIG. 1 is a schematic diagram of a conventional MOS inverter circuit.
Figure 2:
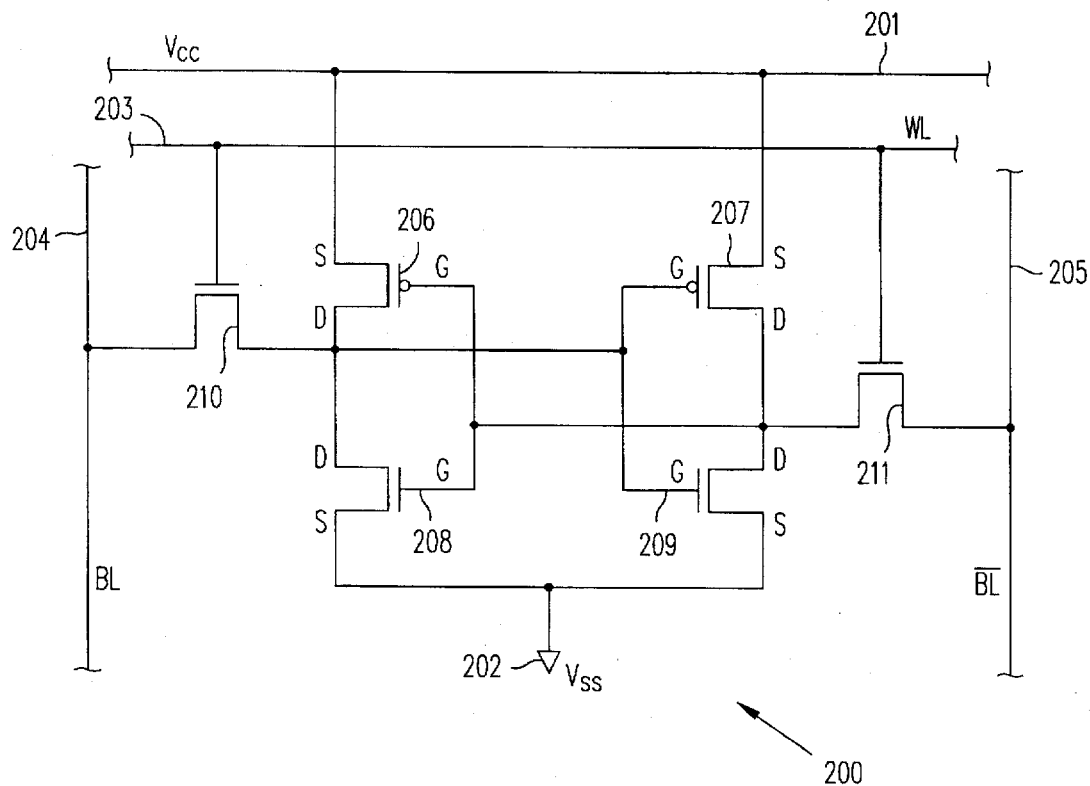
FIG. 2 is a schematic diagram of a conventional six transistor SRAM memory cell.
Figure 3:
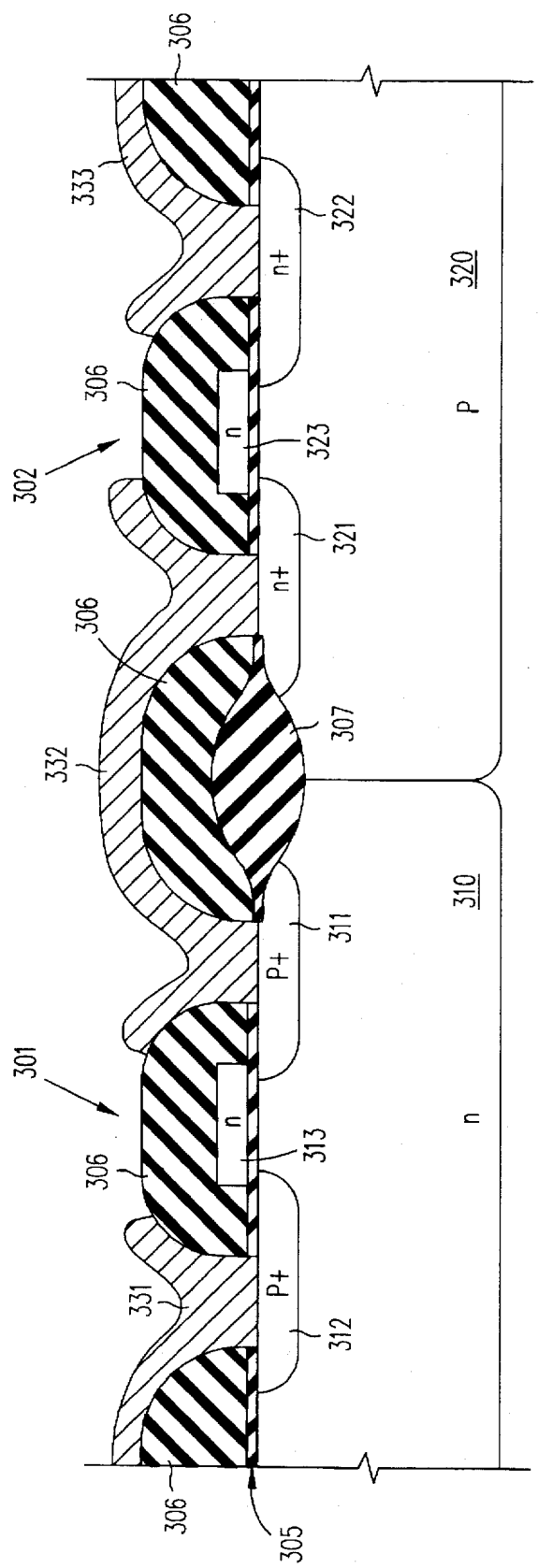
FIG. 3 is a cross-sectional view of a conventional drain-to-drain connection between an n-channel FET and a p-channel FET.

Furthermore, an SRAM memory cell fabricated using transistor structure 400 is less sensitive to alpha particle upset than an SRAM memory cell which uses the conventional inverter circuit illustrated in FIG. 3. This is because buried dielectric region 407 reduces the area for carrier collection between n-type region 410 and p+ drain 411, and also reduces the area for carrier collection between p-type region 420 and n+drain 421.

Electrically conductive layer 430, typically metal, includes electrode 432 which makes electrical connection to both p+ drain region 411 and n+ drain region 421, thereby reducing the complexity of conductive layer 430. Electrodes 431 and 433 of conductive layer 430 contact p+ source region 412 and n+ source region 422, respectively.

Figure 5C:
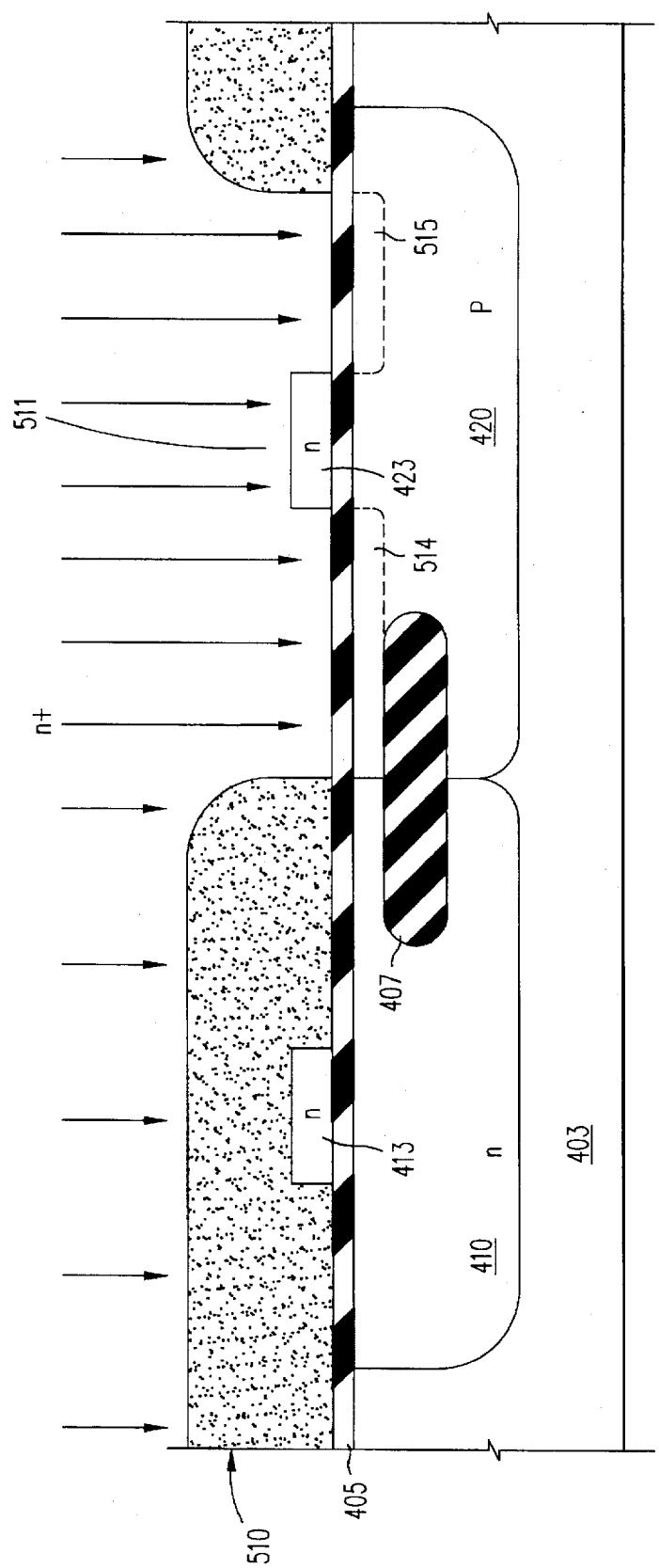

FIGS. 5a–5e illustrate one method for making transistor structure 400. Turning to FIG. 5a, substrate 403 is a monocrystalline semiconductor material, typically silicon. In different variations, substrate 403 can be n-type, p-type or intrinsic silicon. A photoresist mask 501 is formed over substrate 403. Mask 501 has an opening 502 which exposes a portion of substrate 403 which will eventually include portions of both n-type body region 410 and p-type body region 420. A high energy ion implant is performed through opening 502 using either oxygen or nitrogen ions. In one embodiment, oxygen ions are implanted at a dosage of approximately 1E17 to 1E18 ions/cm$^2$ and a range of 0.3 to 1.0 µm. The implanted ions are concentrated within region 504, beneath the upper surface of n-type body region 410 and p-well 420. This implant can alternatively be performed through an oxide layer (not shown) overlying regions 410 and 420.

An anneal step is then performed, thereby forming buried dielectric region 407 (FIG. 5b). The anneal is performed at a temperature between 900° C. and 1100° C. After the anneal step is performed, the upper surface of buried dielectric region 407 is located approximately 0.2 to 0.5 µm below the upper surfaces of regions 410 and 420. Dielectric region 407 is either silicon oxide (for an oxygen implant) or silicon nitride (for a nitrogen implant). Mask 501 is removed.

N-well 410 and p-well 420 are then formed using conventional masking steps, high energy ion implants and at least one annealing step. The high energy implants allow some of the n-type and p-type dopant to pass through dielectric region 407, thereby placing dopant in the appropriate locations. An anneal step is performed after the high energy implants to form well regions 410 and 420. N-well 410 and p-well 420 are typically formed after dielectric region 407 is annealed because the high temperatures associated with the anneal of dielectric region 407 could otherwise cause excessive diffusion of regions 410 and 420. This is particularly true if dielectric region 407 is annealed at a temperature greater than 1000° C. Appropriate masking, implantation and annealing steps which can be used to form well regions 410 and 420 are described in more detail below in connection with FIGS. 7c and 7d.

If dielectric region 407 is annealed at a temperature closer to 900° C., it is possible to perform the ion implantations used to create n-well 410 and p-well 420 prior to performing the implant used to create dielectric region 407. Similarly, if the anneal temperature of dielectric region 407 is close to 900° C., it is possible to perform the ion implantation used to create one of n-well 410 or p-well 420, then perform the implant used to create dielectric region 407, and then perform the ion implantation used to create the other one of n-well 410 or p-well 420.

In another variation, substrate 403 is used to replace either of n-well 410 or p-well 420. For example, if substrate 403 is made of p-type material, substrate 403 can be used in place of p-well 420. In such a variation, the ion implantation used to create n-well 410 can be initiated before or after the implant used to create dielectric region 407.

Gate oxide layer 405 is thermally grown over the upper surface of the resulting structure. Gate oxide layer 405 is a conventional layer having a thickness ranging from tens of angstroms to a few hundred angstroms. Electrically conductive gate electrodes 413 and 423, typically polysilicon, are then fabricated over gate oxide layer 405 as illustrated in FIG. 5b. Gate electrodes 413 and 423 are doped in accordance with conventional techniques.

Figure 5D:
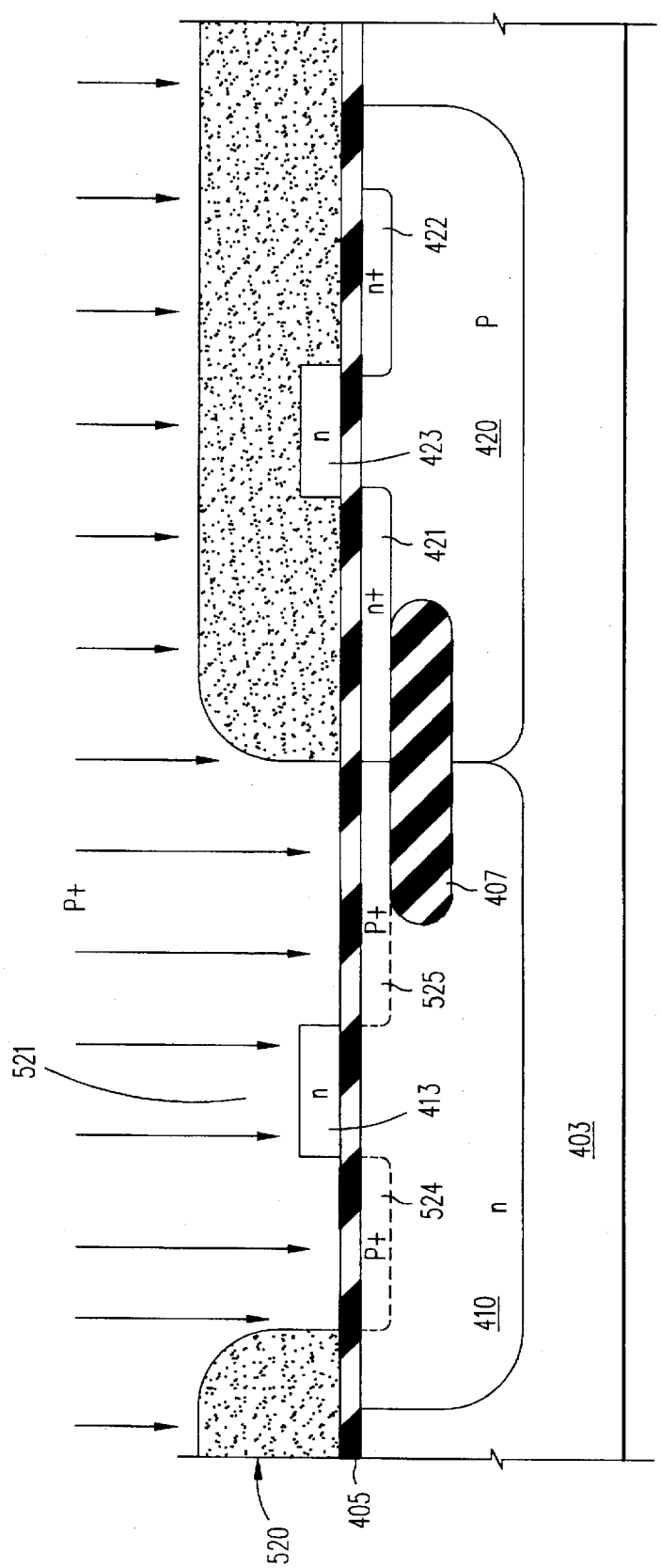

Turning to FIG. 5c, another photoresist mask 510 is formed over the upper surface of the resulting structure, with an opening 511 which defines an active region of n-channel FET 402. A low energy implant (e.g., 150 keV) of n-type dopant, typically arsenic, is performed through opening 511 and gate oxide 405, at a high dosage (e.g., on the order of 1E15 ions/cm$^2$), thereby placing the n-type dopant in regions 514 and 515. Gate electrode 423 functions as an implant shield for self-aligning regions 514 and 515 to electrode 423. Mask 501 is removed. An anneal is then performed to activate the n-type dopant, thereby forming n+ drain region 421 and n+ source region 422 (FIG. 5d).

Figure 5E:
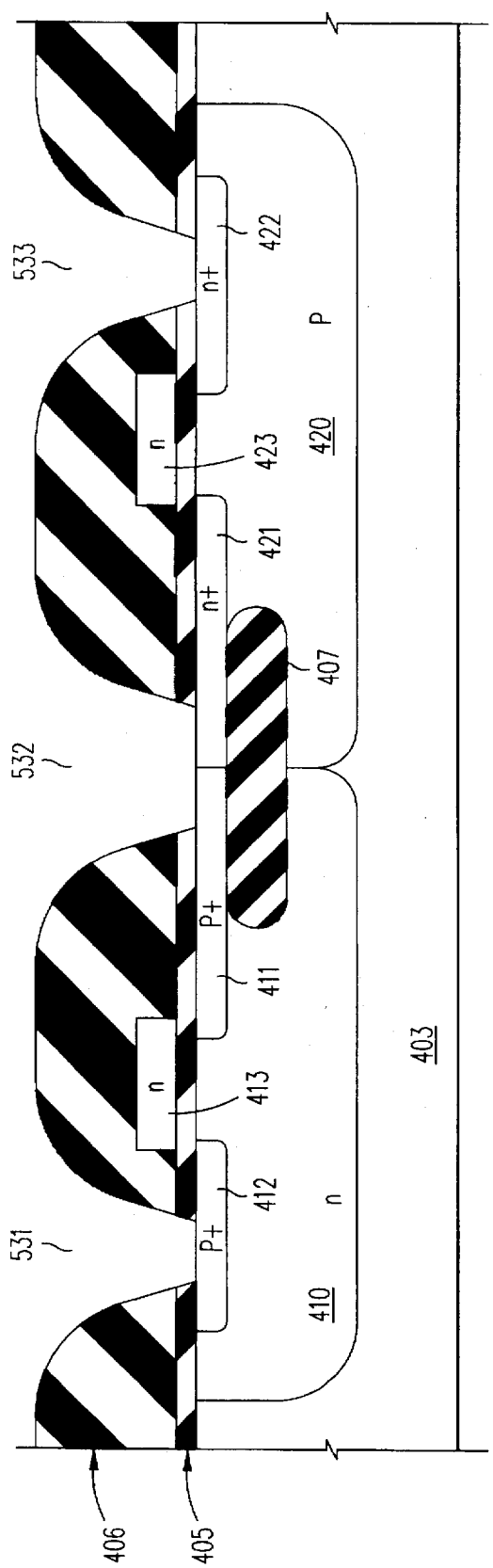

Mask 510 is removed and another photoresist mask 520 is formed over the upper surface of the resulting structure, with an opening 521 which defines an active region of p-channel FET 401. A low energy (e.g., 70 keV) implant of p-type dopant, typically boron, is performed through opening 521 and gate oxide 405 at a high dosage (e.g., on the order of 1E15 ions/cm$^2$), thereby placing the p-type dopant in regions 524 and 525. Gate electrode 413 functions as an implant shield to self-align regions 524 and 525 to electrode 413. Mask 520 is removed. Another anneal is performed to activate the implanted p-type dopant, thereby forming p+ source region 412 and p+ drain region 411 (FIG. 5e). In a preferred embodiment, p+ drain region 411 adjoins n+ drain region 421.

In one variation, a single anneal can be performed after both the n-type dopant is implanted in regions 514–515 and the p-type dopant is implanted in regions 524–525.

In another variation, drain regions 411, 421 and source regions 412, 422 are formed before dielectric region 407 is formed. In such a variation, dielectric region 407 is preferably annealed at a relatively low temperature (i.e., 900° C.) to prevent excessive diffusion of drain regions 411, 421 and source regions 412, 422.

Insulating layer 406 is formed on top of the structure using conventional methods (FIG. 5e). Contact openings 531–533 are formed in insulating layer 406 and gate oxide layer 405. Electrically conductive layer 430, which includes electrodes 431–433, is then formed over insulating layer 406 as shown in FIG. 4, thereby completing the fabrication of transistor structure 400.

Figure 6C:
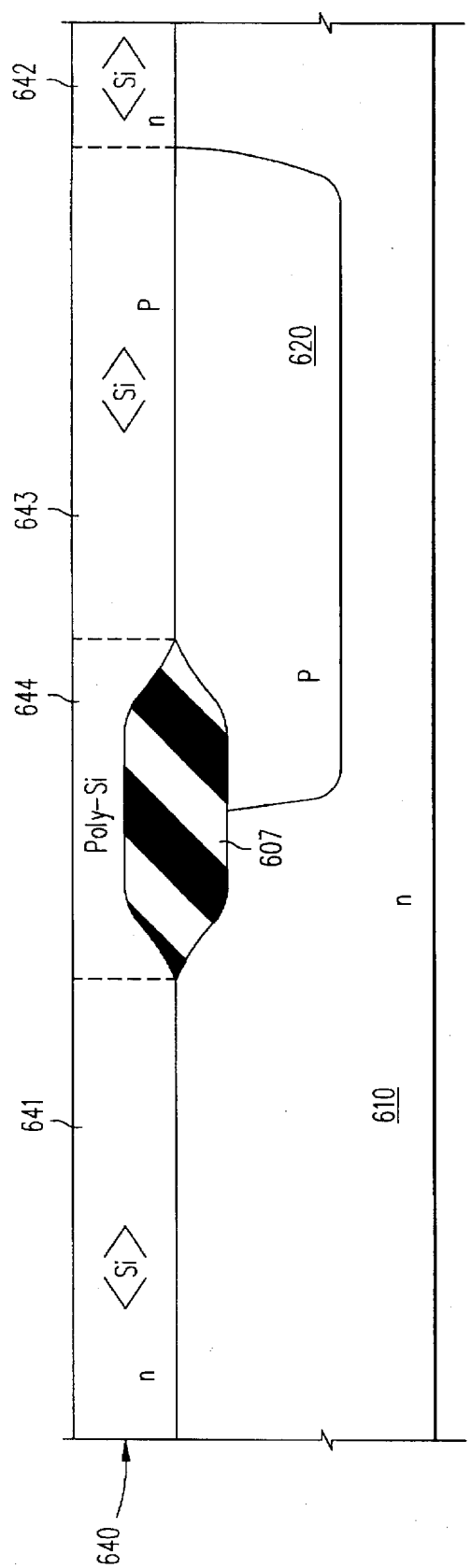

FIGS. 6a–6g illustrate a method for forming a complementary p-channel/n-channel transistor structure 600 similar to transistor structure 400 (FIG. 4). As illustrated in FIG. 6a, pad oxide layer 601a and oxygen impervious mask 601b, typically silicon nitride, are formed over an upper surface of monocrystalline semiconductor body 610 of a first conductivity type (e.g., an n-type monocrystalline silicon substrate). Semiconductor body 610 has formed therein a body region 620 of a second conductivity type opposite the first conductivity type (e.g., a p-well). Mask 601 includes opening 602 which is located over portions of both substrate 610 and p-well 620.

A thermal oxidation step is performed at a temperature of 1000° C. to 1100° C., and mask 601b is then removed, resulting in the structure illustrated in FIG. 6b. The thermal oxidation step results in field oxide region 607 being formed along the upper surface of substrate 610 and p-well 620, where opening 602 previously existed. The thickness of field oxide region 607 is in the range of a few hundred to a few thousand angstroms. A conventional oxide removal step (using, e.g., HF) is performed to remove pad oxide layer 601a without excessively thinning field oxide region 607.

A composite layer of silicon 640 having a thickness of approximately 0.1 to 0.5 μm is then grown. Silicon layer 640 is referred to as a composite layer because silicon layer 640 includes regions of epitaxially grown silicon and polycrystalline silicon. Silicon layer 640 includes four regions 641–644. Regions 641 and 642, formed over n-type substrate 610, are n-type epitaxially grown regions having the same monocrystalline silicon structure as substrate 610. Region 643, formed over p-well 620, is a p-type epitaxially grown region having the same monocrystalline silicon structure as p-well 620. Region 644, formed over field oxide region 607, is non-monocrystalline silicon (i.e., polysilicon or amorphous silicon). If composite silicon layer 640 is thin enough (i.e., approximately 0.1 μm or less), the diffusion of dopant from underlying regions is sufficient to dope regions 641–644. If silicon layer 640 is to have a thickness much greater than 0.1 μm, then regions 641–642 should be doped to an n-type conductivity and region 643 should be separately doped to a p-type conductivity.

In an alternative embodiment, dielectric region 607 is formed prior to p-well 620. Such an embodiment has several variations. In one variation, p-well 620 is formed before composite silicon layer 640 is formed. Composite layer 640 is then doped by diffusion of dopant from the underlying n-type substrate 610 and p-well 620, or by separate doping steps. In another variation, composite layer 640 is grown before p-well 620 is formed. P-well 620 and regions 643 and 644 are then simultaneously doped by implanting a p-type impurity at a high energy and then performing an anneal.

In yet another embodiment, an n-well region (not shown) is formed adjacent to p-well region 620. In such an embodiment, a p-channel FET is formed using this n-well region. Such an n-well region can be formed before or after dielectric region 607.

Figure 6D:
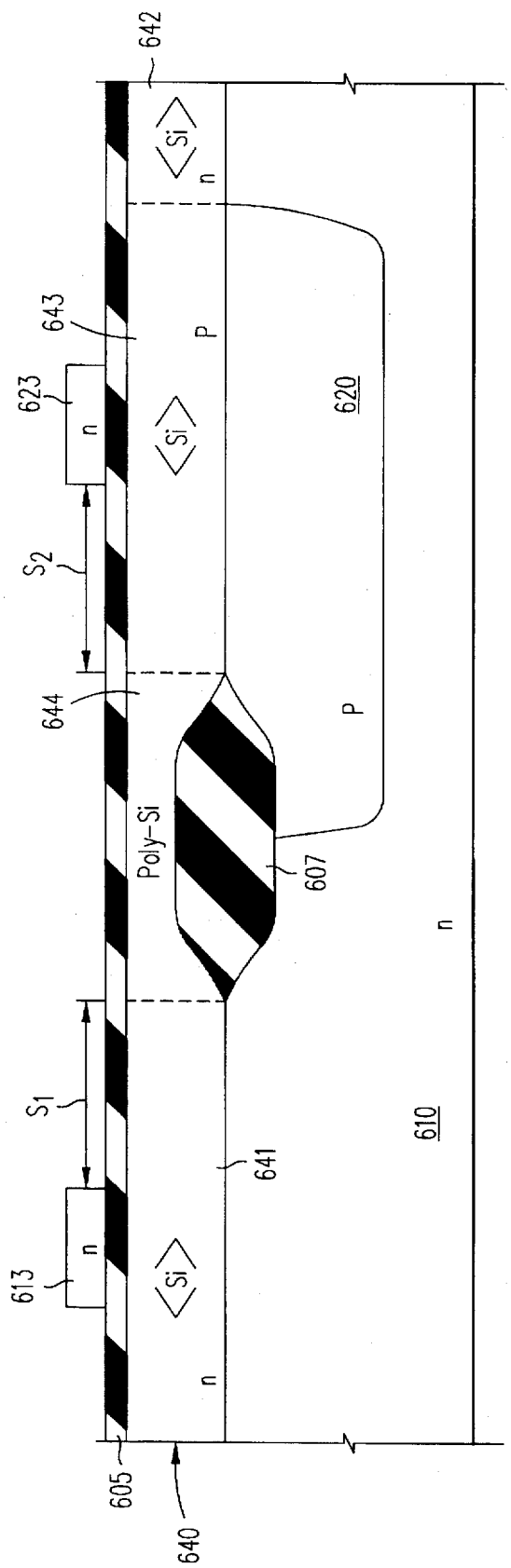

Turning now to FIG. 6d, gate oxide layer 605 is thermally grown over composite silicon layer 640. Gate electrodes 613 and 623, typically polysilicon, are then formed over gate oxide layer 605 and doped. Gate electrode 613 is spaced a first lateral distance S1 from polysilicon region 644. Similarly, gate electrode 613 is spaced a second lateral distance S2 from polysilicon region 644. Lateral distances S1 and S2 provide space for drain regions to be formed in monocrystalline regions 641 and 643.

Figure 6E:
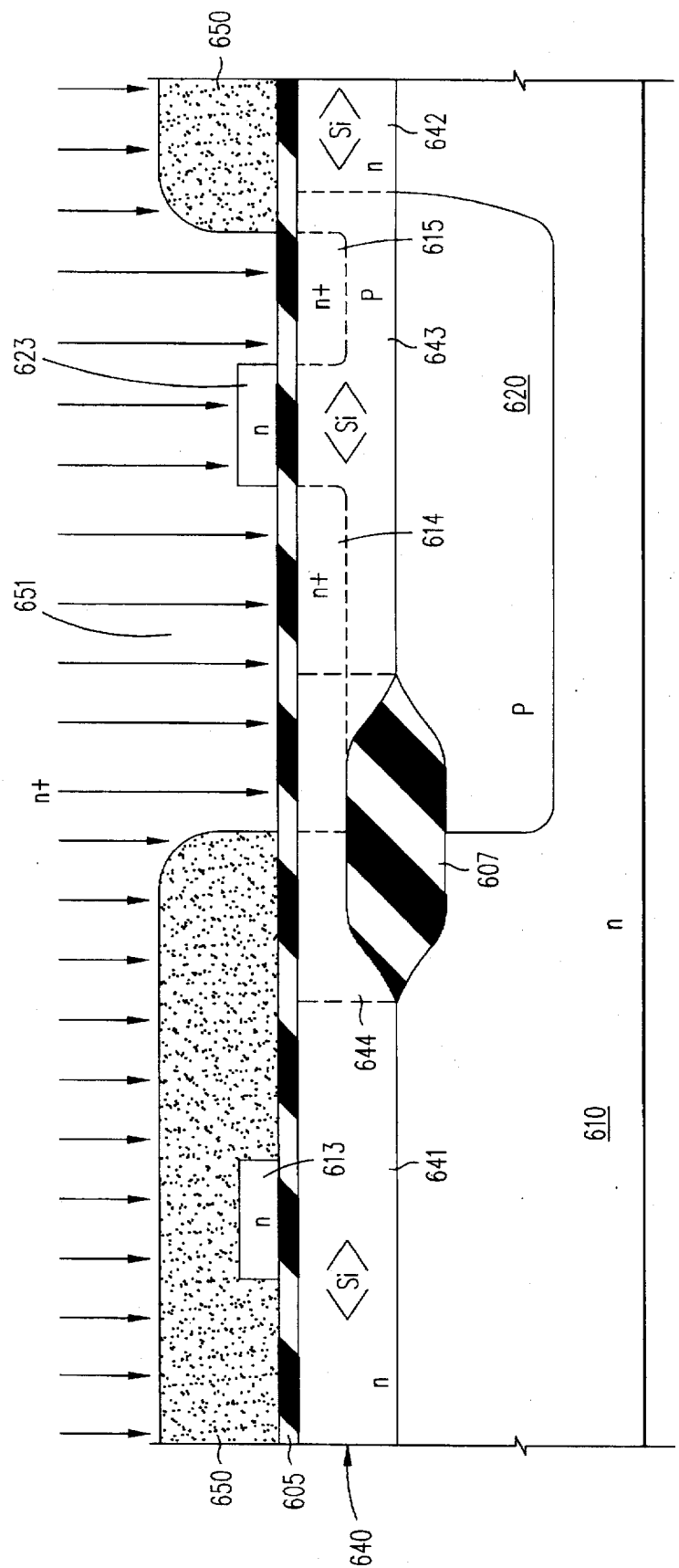

Photoresist mask 650 is then formed over the resulting structure (FIG. 6e). Mask 650 includes opening 651, which exposes p-type region 643, gate electrode 623 and a portion of polysilicon region 644. A low energy implant (e.g., 150 keV) of n-type dopant, typically arsenic, is performed through opening 651 and gate oxide 605, at a high dosage (e.g., on the order of 1E15 ions/cm$^2$), thereby placing the n-type dopant in regions 614 and 615. Mask 650 is removed, and an anneal step is performed, thereby forming n+ drain region 621a, n+ polysilicon drain extension region 621b and n+ source region 622 (FIG. 6f).

Figure 6F:
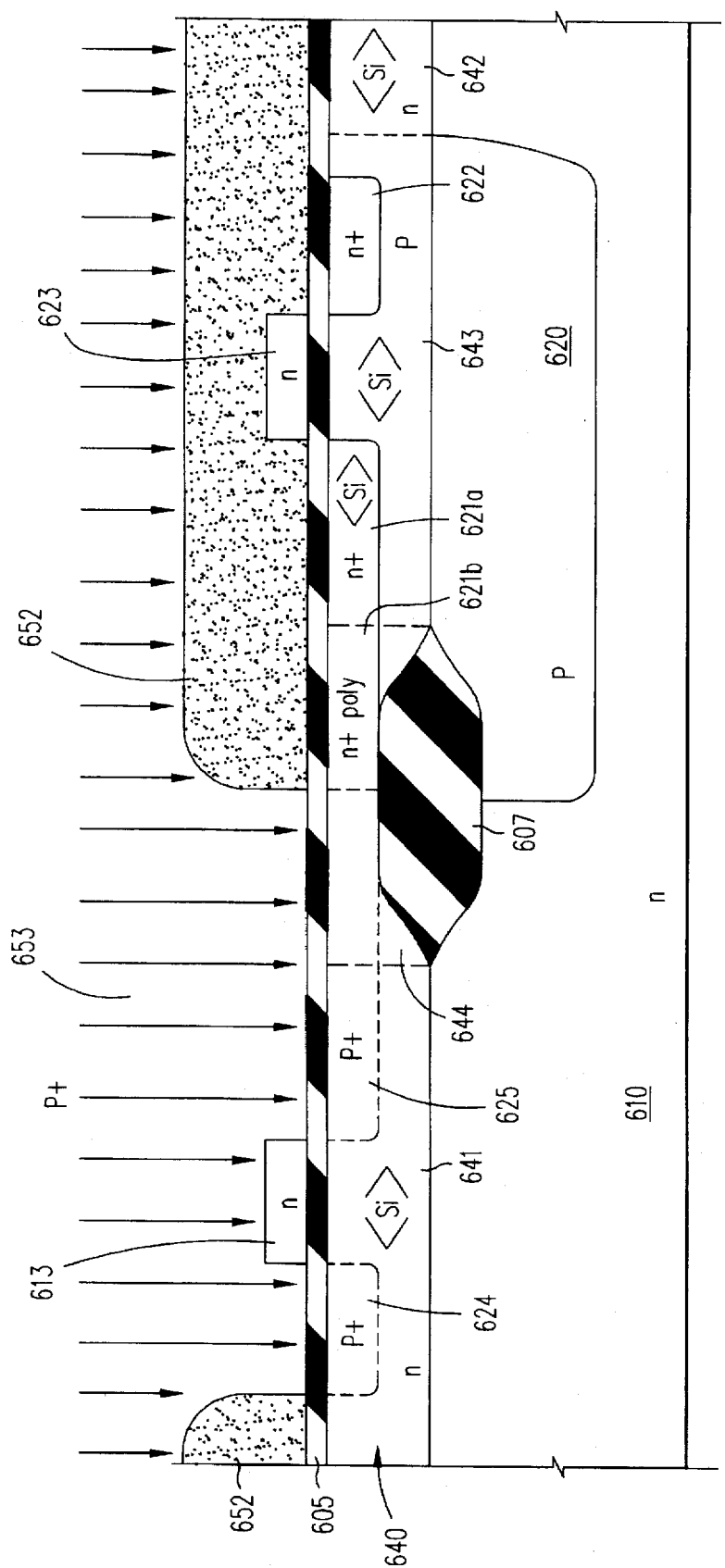
Figure 6G:
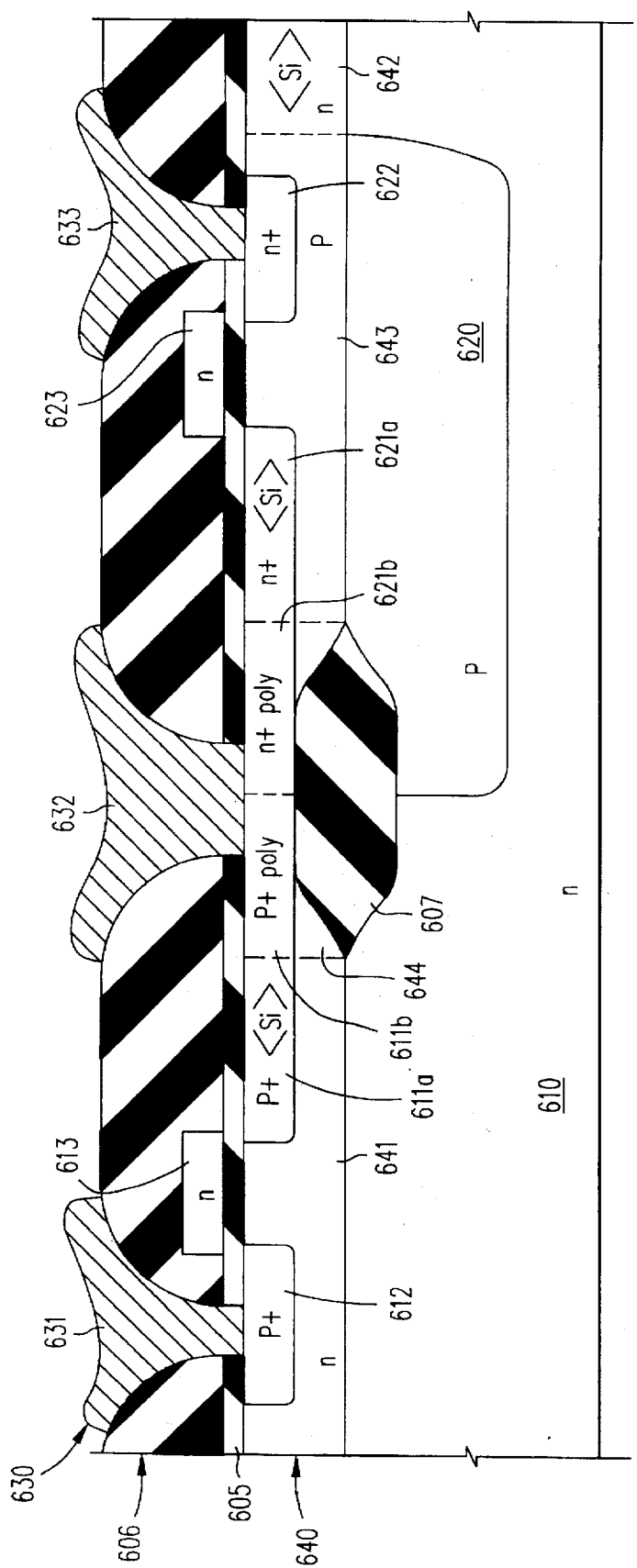

Photoresist mask 652 is formed over the resulting structure (FIG. 6f). Mask 652 includes opening 653, which exposes n-type region 641, gate electrode 613 and a portion of polysilicon region 644. A low energy (e.g., 70 keV) implant of p-type dopant, typically BF$_2$+, is performed through opening 653 and gate oxide 605, at a high dosage (e.g., on the order of 1E15 ions/cm$^2$), thereby placing the p-type dopant in regions 624 and 625. An anneal step is performed, thereby forming p+ drain region 611a, n+ polysilicon drain extension region 611b and n+ source region 612 (FIG. 6g). Alternatively, a single anneal can be performed after both the n-type and p-type ion implants are performed.

Insulating layer 606 and metal interconnect layer 630, which includes electrodes 631–633, are formed over the resulting structure (FIG. 6g). Electrode 632 contacts the doped polycrystalline drain extension regions 611b and 621b to provide a conductive path to drain regions 611a and 621a.

In an alternative method, after composite silicon layer 640 is grown (FIG. 6c), polycrystalline silicon region 644 is heated in such a manner as to melt region 644, thereby transforming region 644 into monocrystalline silicon. Region 644 can be heated in various ways, such as by using a laser or conventional heating elements typically used in silicon-on-insulator processes.

Figure 7A:
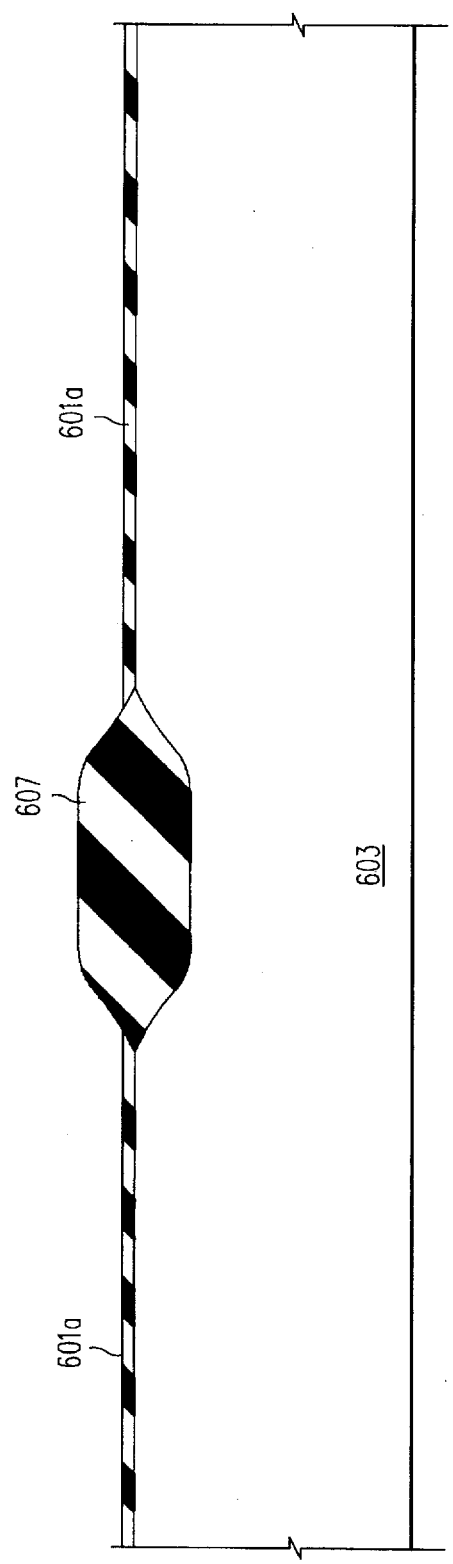
FIGS. 7a–7d are cross-sectional views illustrating another method for forming an FET structure in accordance with the invention.
Figure 7B:
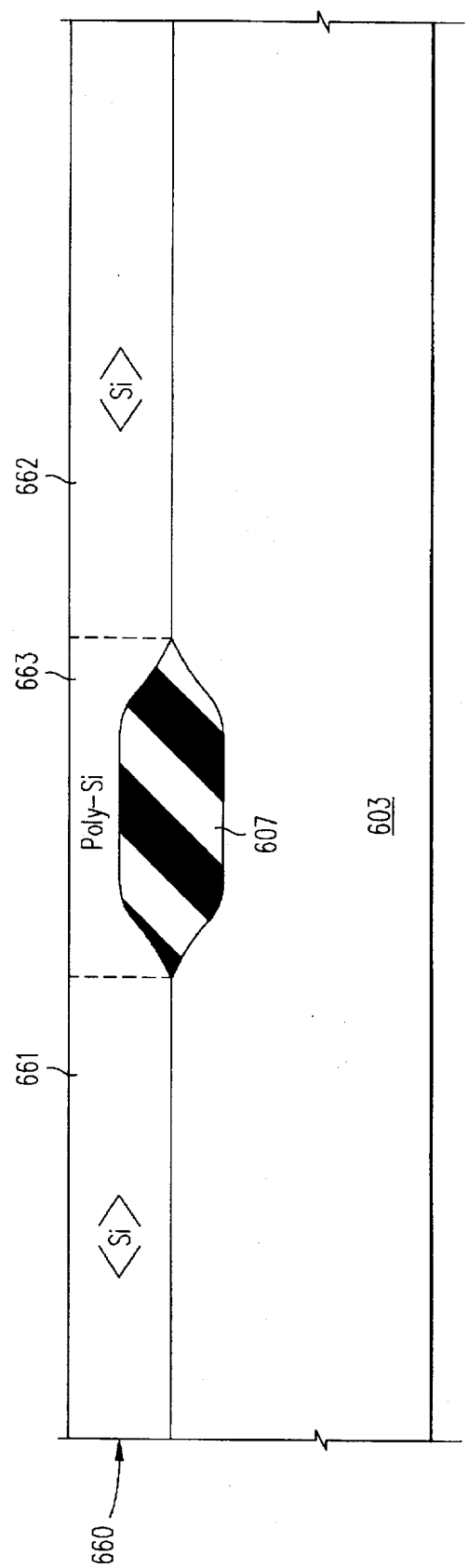

FIGS. 7a–7d illustrate a variation of the embodiment previously described in connection with FIGS. 6a–6g. In FIG. 7a, dielectric region 607 and pad oxide layer 601a are formed over monocrystalline semiconductor substrate 603. Substrate 603 is typically n-type, p-type or intrinsic monocrystalline silicon. As shown in FIG. 7b, composite silicon layer 660 is grown over the resulting structure in the same manner as composite silicon layer 640 (FIG. 6c). Composite silicon layer 660 includes monocrystalline silicon regions 661 and 662 and polysilicon region 663.

Figure 7C:
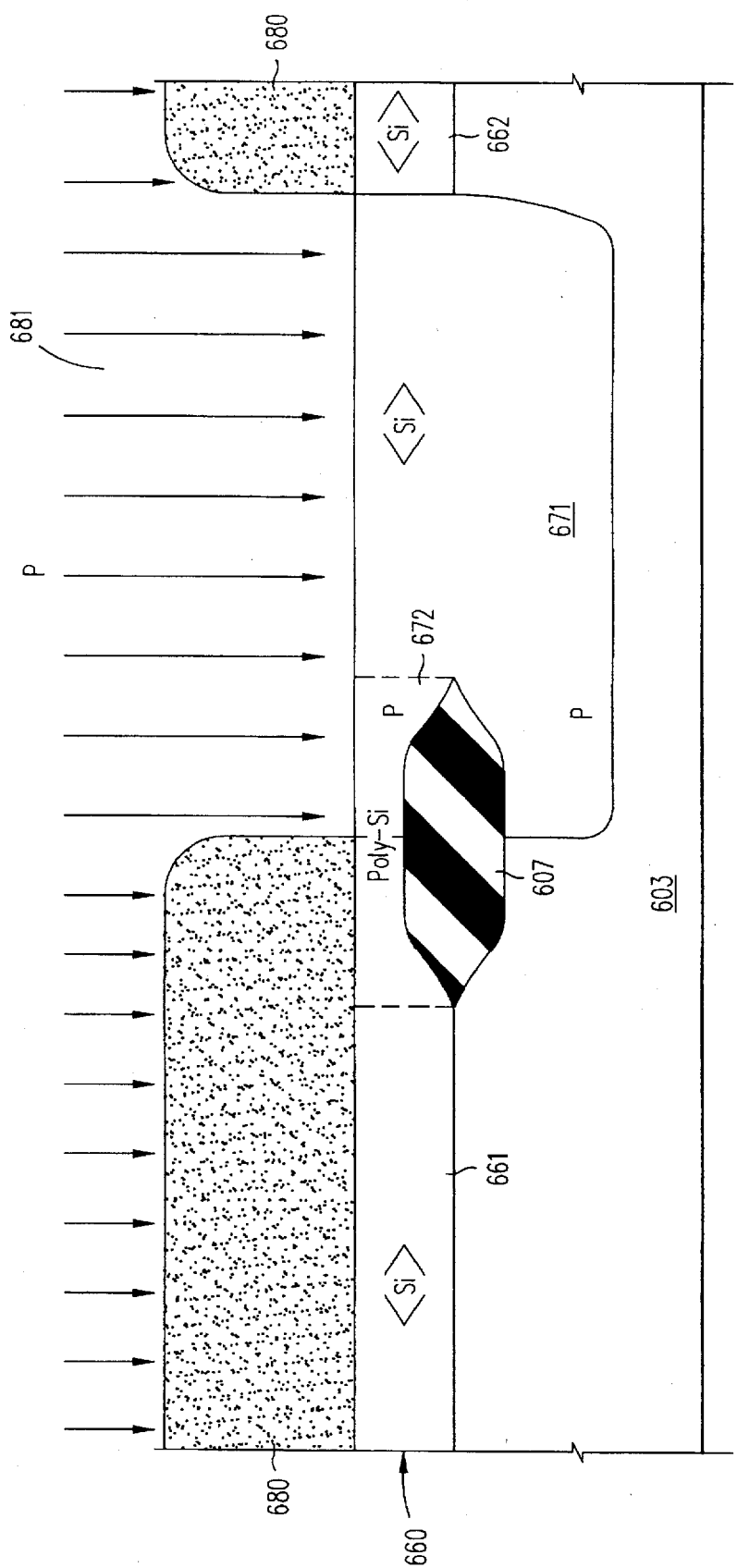

A photoresist mask 680 is formed over the upper surface of composite silicon layer 660 (FIG. 7c). Mask 680 includes an opening 681 which defines the location of p-well 671. A series of high energy ion implants (e.g., two to four implants at 50 KeV to 500 KeV) are performed to provide a surface concentration of approximately 1E15 to 3E17 ions/cm$^3$ using a p-type dopant. The high energy implants allow dopant to pass through dielectric region 607. An anneal is then performed to form p-well region 671 and p-type polysilicon region 672.

Figure 7D:
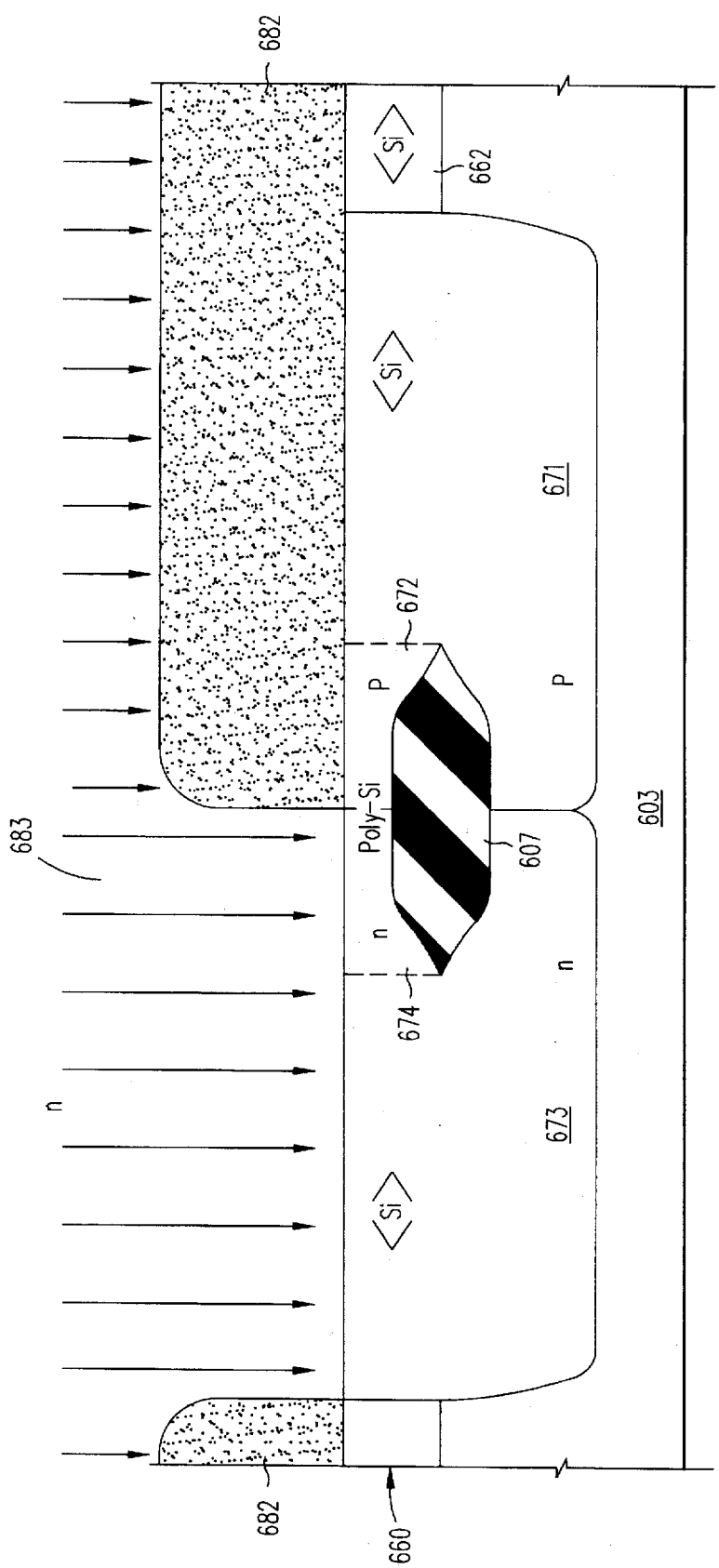

Mask 680 is removed and another photoresist mask 682 is formed over the upper surface of composite silicon layer 660 (FIG. 7d). Mask 682 includes an opening 683 which defines the location of n-well 671. A series of high energy ion implants (e.g., two to four implants at 50 KeV to 3 MeV) are performed to provide a surface concentration of approximately 1E15 to 3E17 ions/cm$^3$ using an n-type dopant. Again, the high energy implants allow dopant to pass through dielectric region 607. An anneal is then performed to form n-well region 673 and n-type polysilicon region 674. Mask 682 is then removed and processing continues as previously described in connection with FIGS. 6d–6g.

Figure 8A:
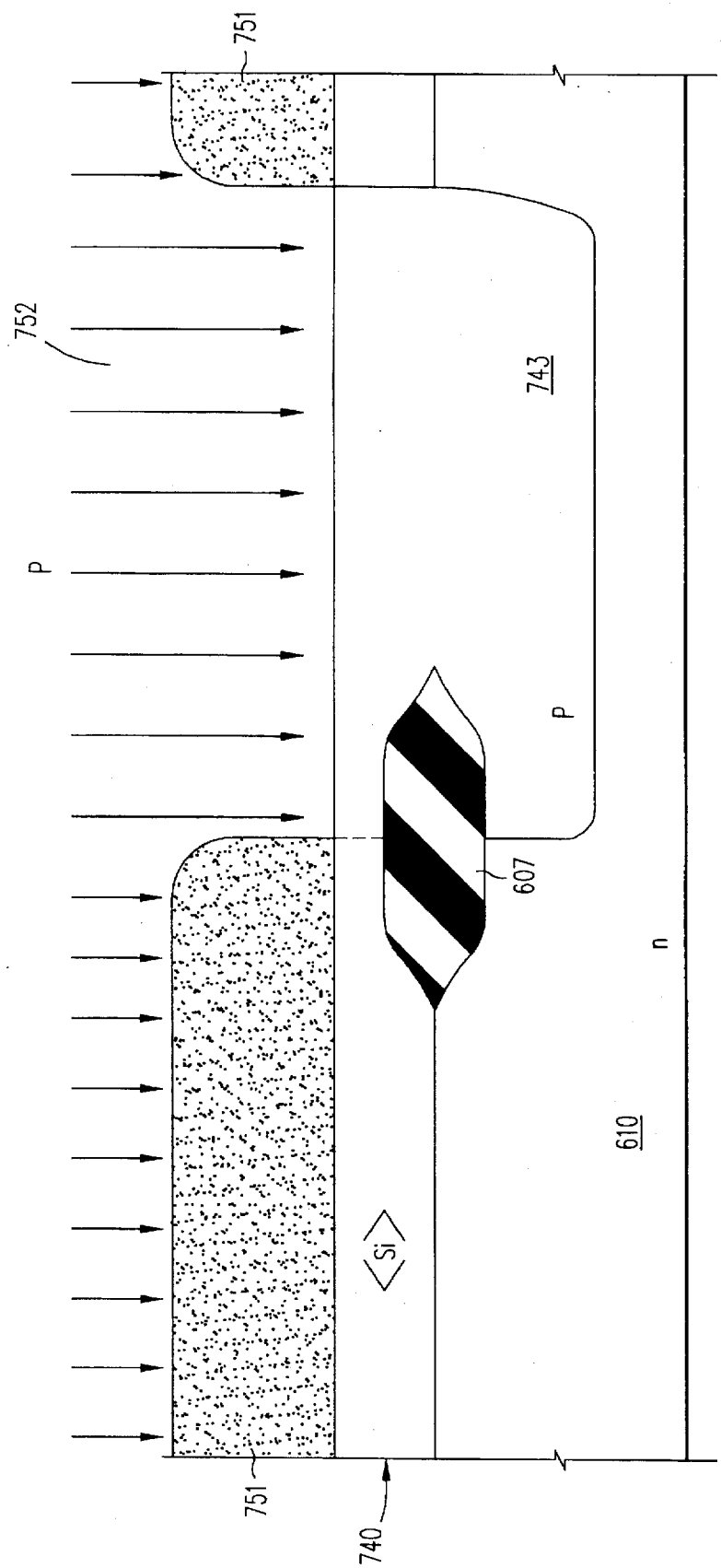
FIGS. 8a–8c are cross-sectional views illustrating yet another method for forming an FET structure in accordance with the invention.
Figure 8B:
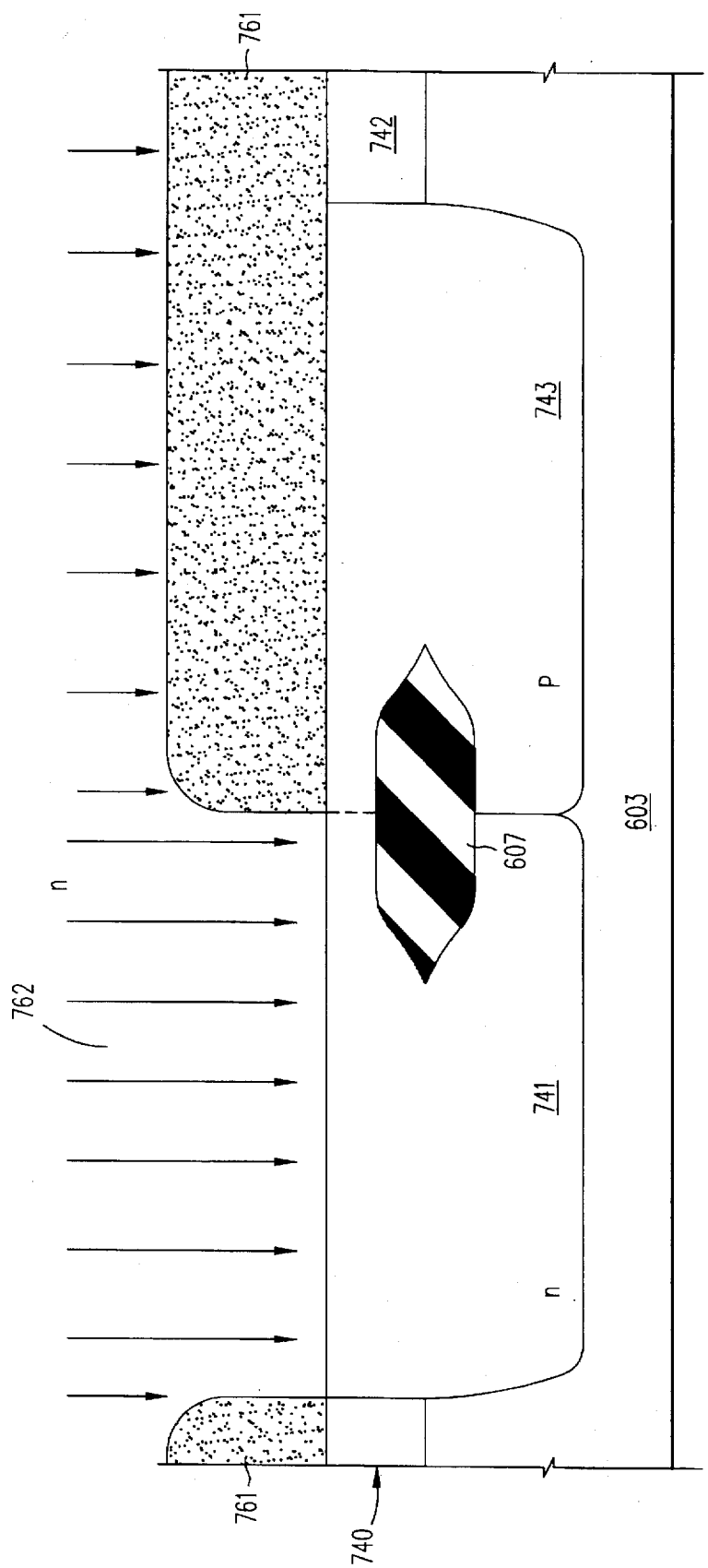
Figure 8C:
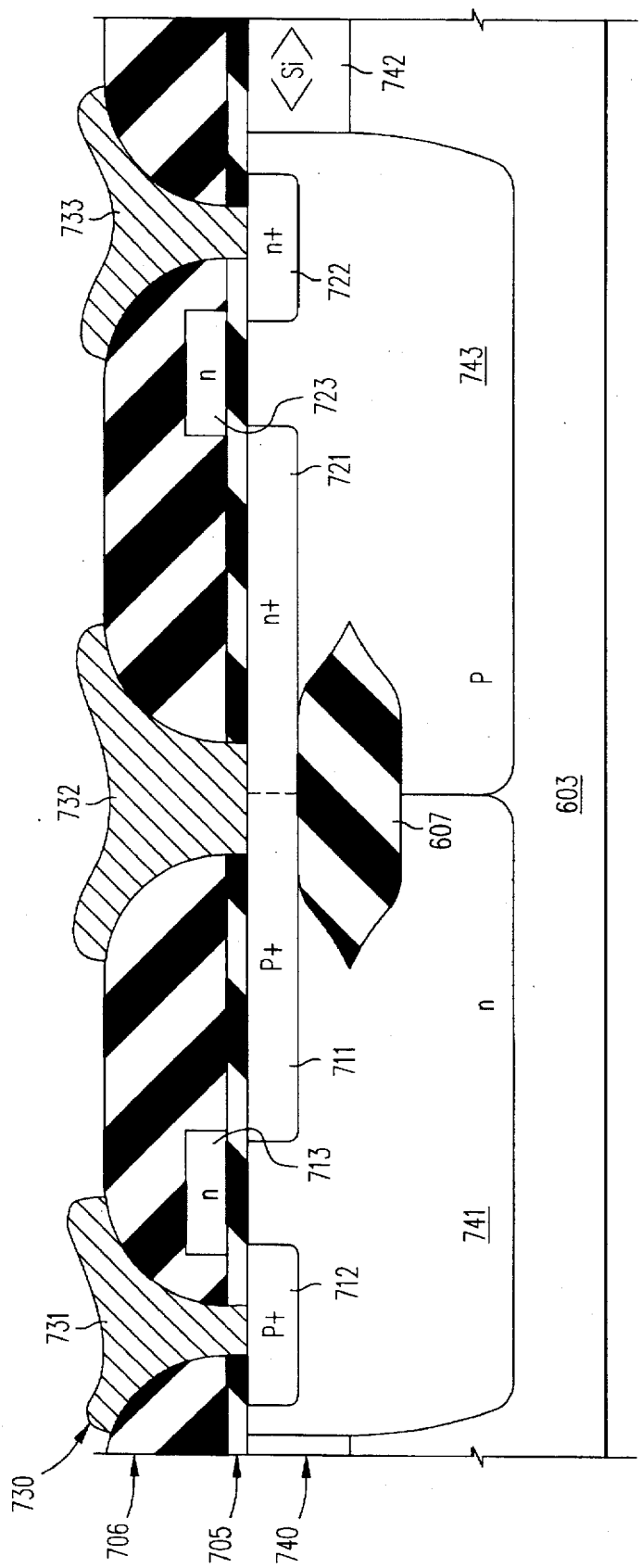

FIGS. 8a–8c illustrate another variation of the invention. To create the structure illustrated in FIG. 8a, pad oxide layer 601a is removed from the structure of FIG. 7a. A layer of non-monocrystalline silicon (not shown) is then deposited over the upper surface of the resulting structure. This non-monocrystalline silicon layer is typically amorphous silicon but could also be polysilicon. This silicon layer is crystallized by melting the silicon layer with a laser or a heating element. As a result, the non-monocrystalline silicon layer is transformed into a monocrystalline silicon layer 740.

Photoresist mask 751 is formed over silicon layer 740 with an opening 752 located over the region which is to include p-well 743 (FIG. 8a). A p-type dopant is implanted through opening 752 into silicon layer 740, thereby creating a region 743 which contains p-type dopant. The energy of the implant is high enough so that some of the p-type dopant is able to pass through dielectric region 607.

Photoresist mask 751 is removed, and another photoresist mask 761 is formed over the upper surface of the resulting structure (FIG. 8b). Mask 761 includes an opening 762 formed over the region which is to become n-well region 741. An n-type dopant is implanted through opening 762 at a high energy, thereby providing n-type dopant in region 741. Mask 761 is removed and an anneal is performed, thereby forming adjacent n-well region 741 and p-well region 743. N-well region 741 and p-well region 743 are typically formed after the non-monocrystalline silicon layer is crystallized because the heat applied during the crystallization step can cause excessive diffusion of such n-well and p-well regions.

Processing continues in a manner similar to that previously described in connection with FIGS. 5b–5e and FIGS. 6d–6g to form transistor structure 700 (FIG. 8c). In addition to the elements previously described, transistor structure 700 further includes gate oxide 705, gate electrodes 713 and 723, p+ source region 712, p+ drain region 711, n+ source region 721, n+ drain region 722, insulating layer 706 and electrically conductive layer 730, which includes source contact electrodes 731 and 733 and drain contact electrode 732.

Figure 9:
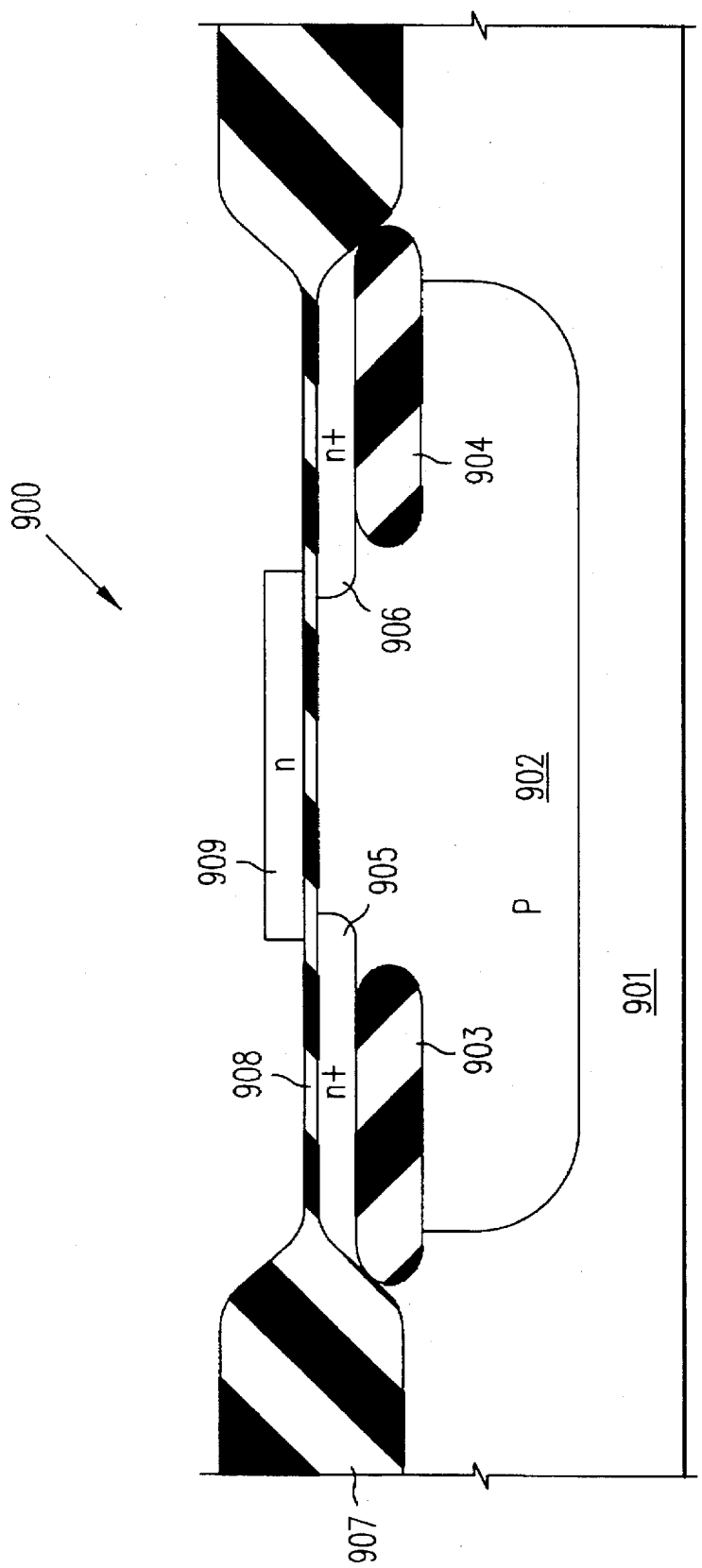
FIG. 9 is a cross-sectional view illustrating a single FET in accordance with an alternative embodiment of the invention.

The present invention is applicable to structures other than a p-channel/n-channel FET pair. For example, FIG. 9 illustrates an embodiment of the invention which includes only an n-channel FET 900. FET 900 is formed in p-well region 902. Buried dielectric regions 903 and 904 are located below drain and source regions 905 and 906, respectively, of n-channel FET 900. Field oxide 907, gate oxide 908 and gate electrode 909 are also included in FET 900. Dielectric regions 903 and 904 reduce the junction capacitance of FET 900 and the sensitivity of FET 900 to alpha particle upset in the same manner as the previously described dielectric regions. P-well 902, dielectric regions 903 and 904 and source/drain regions 905 and 906 of FET 900 can be fabricated in accordance with the various techniques previously set forth in connection with FIGS. 5a–5e, 6a–6g, 7a–7d and 8a–8c.

Although the invention has been described in connection with several embodiments, it is understood that this invention is not limited to the embodiments disclosed, but is capable of various modifications which would be apparent to a person skilled in the art. For example, the specific conductivity types presented in the described embodiments can be reversed to achieve similar results. Furthermore, the present invention can be applied to lightly doped drain (LDD) field effect transistors. The invention can also be used in BiCMOS as well as CMOS processes. Moreover, the invention can be used with P/N junction isolation or dielectric isolation. Thus, the invention is limited only by the following claims.

I claim:

1. A semiconductor structure for a transistor pair comprising:
   a semiconductor body having an upper surface, a first body region of a first conductivity type and an adjoining second body region of a second conductivity type opposite to the first conductivity type;
   a dielectric region located in the semiconductor body beneath the upper surface of the semiconductor body and extending into the first and second body regions;
   a first drain region of the second conductivity type located in the semiconductor body, the first drain region adjoining the first body region, the dielectric region and the upper surface of the semiconductor body; and
   a second drain region of the first conductivity type located in the semiconductor body, the second drain region adjoining the second body region, the dielectric region and the upper surface of the semiconductor body, the second drain region also adjoining the first drain region.

2. The structure of claim 1, further including an electrically conductive element which contacts the first and second drain regions at the upper surface of the semiconductor body.

3. The structure of claim 1, further including:
   a first source region of the second conductivity type located in the first body region spaced apart from the first drain region;
   a second source region of the first conductivity type located in the second body region spaced apart from the second drain region;
   an insulating layer situated over the upper surface of the semiconductor body;
   a first gate electrode located over the insulating layer and extending over the first drain region and the first source region; and
   a second gate electrode located over the insulating layer and extending over the second drain region and the second source region.

4. The structure of claim 1, wherein the first and second drain regions comprise monocrystalline semiconductor material.

5. The structure of claim 1, wherein the structure is incorporated in an inverter circuit.

6. The structure of claim 1, wherein the structure is part of a static random access memory cell.

7. The structure of claim 1, wherein the dielectric region is located entirely below the upper surface of the semiconductor body.

8. A semiconductor structure for a transistor pair comprising:
   a semiconductor body having an upper surface, a first body region of a first conductivity type and an adjoining second body region of a second conductivity type opposite to the first conductivity type;
   a dielectric region located in the semiconductor body below the upper surface of the semiconductor body and extending into the first and second body regions;
   a first drain region of the second conductivity type located in the semiconductor body, the first drain region located above the dielectric region and adjoining the first body region and the upper surface of the semiconductor body; and
   a second drain region of the first conductivity type located in the semiconductor body, the second drain region located above the dielectric region and adjoining the second body region and the upper surface of the semiconductor body, the second drain region also being adjacent to the first drain region, wherein the first and second drain regions comprise monocrystalline semiconductor material;
   a first drain extension region of the second conductivity type located in the semiconductor body, the first drain extension region adjoining the first drain region, the dielectric region and the upper surface of the semiconductor body; and
   a second drain extension region of the first conductivity type located in the semiconductor body, the second drain extension region adjoining the second drain region, the dielectric region and the upper surface of the semiconductor body, the second drain extension region also adjoining the first drain extension region, wherein the first and second drain extension regions comprise polycrystalline semiconductor material.

9. The structure of claim 8, wherein the dielectric region is located entirely below the upper surface of the semiconductor body.

10. The structure of claim 8, further comprising an electrically conductive element which contacts the first and second drain regions at the upper surface of the semiconductor body.

11. The structure of claim 8, further comprising:
   a first source region of the second conductivity type located in the first body region spaced apart from the first drain region;
   a second source region of the first conductivity type located in the second body region spaced apart from the second drain region;
   an insulating layer situated over the upper surface of the semiconductor body;
   a first gate electrode located over the insulating layer and extending over the first drain region and the first source region; and
   a second gate electrode located over the insulating layer and extending over the second drain region and the second source region.

* * * * *